(12) United States Patent
Choi (10) Patent No.: US 12,192,312 B2
(45) Date of Patent: Jan. 7, 2025

(54) APPARATUS AND METHOD FOR PROVIDING BATTERY INFORMATION

(71) Applicant: LG ENERGY SOLUTION, LTD., Seoul (KR)

(72) Inventor: Young Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 281 days.

(21) Appl. No.: 17/609,526

(22) PCT Filed: Feb. 8, 2021

(86) PCT No.: PCT/KR2021/001659
§ 371 (c)(1),
(2) Date: Nov. 8, 2021

(87) PCT Pub. No.: WO2021/172790
PCT Pub. Date: Sep. 2, 2021

(65) Prior Publication Data
US 2022/0232110 A1 Jul. 21, 2022

(30) Foreign Application Priority Data
Feb. 26, 2020 (KR) .................. 10-2020-0023906

(51) Int. Cl.
*H04L 69/08* (2022.01)
*G01R 31/371* (2019.01)
(Continued)

(52) U.S. Cl.
CPC .......... *H04L 69/08* (2013.01); *G01R 31/371* (2019.01); *H02J 7/00032* (2020.01);
(Continued)

(58) Field of Classification Search
CPC ...................................................... H04L 69/08
See application file for complete search history.

(56) References Cited

U.S. PATENT DOCUMENTS

| 7,576,517 B1 | 8/2009 | Cotton et al. |
| 2011/0161024 A1 | 6/2011 | Sim et al. |
| (Continued) | | |

FOREIGN PATENT DOCUMENTS

| CA | 3 034 856 A1 | 3/2018 |
| CN | 103678779 A | 3/2014 |
| (Continued) | | |

OTHER PUBLICATIONS

Extended European Search Report ('EESR') issued on Sep. 9, 2022 in regards to the European Patent Application No. 21760700.1.
(Continued)

*Primary Examiner* — Joseph H Feild
*Assistant Examiner* — Pameshanand Mahase
(74) *Attorney, Agent, or Firm* — Birch, Stewart, Kolasch & Birch, LLP (57) ABSTRACT

Provided is an apparatus for providing battery information of the present disclosure, which includes: a first communication unit configured to receive first battery information related to a battery from a battery management system by using a first communication protocol; a second communication unit configured to receive second battery information related to the battery and different from the first battery information from the battery management system by using a second communication protocol different from the first communication protocol; and a data conversion unit connected to the first communication unit and the second communication unit and configured to obtain first conversion information by converting the first battery information into a predetermined data structure, obtain second conversion information by converting the second battery information into the predetermined data structure and output the first conversion information and the second conversion information.

20 Claims, 6 Drawing Sheets

(51) Int. Cl.
*G01R 31/387* (2019.01)
*G01R 31/392* (2019.01)
*H02J 7/00* (2006.01)
*H04L 12/40* (2006.01)
*H04L 67/12* (2022.01)

(52) U.S. Cl.
CPC ...... *H02J 7/0047* (2013.01); *H04L 12/40032* (2013.01); *H04L 67/12* (2013.01); *G01R 31/387* (2019.01); *G01R 31/392* (2019.01); *H04L 2012/40215* (2013.01); *H04L 2012/40228* (2013.01)

(56) References Cited

U.S. PATENT DOCUMENTS

| | | | |
|---|---|---|---|
| 2013/0063079 A1* | 3/2013 | Kawai | H02J 7/04 320/107 |
| 2013/0106244 A1 | 5/2013 | Liu et al. | |
| 2013/0214738 A1* | 8/2013 | Chen | B60L 58/13 320/109 |
| 2013/0260672 A1 | 10/2013 | Patil et al. | |
| 2014/0347013 A1* | 11/2014 | Kim | H02J 7/0016 320/134 |
| 2015/0048797 A1* | 2/2015 | Song | G01R 31/382 320/134 |
| 2015/0127876 A1 | 5/2015 | Erni et al. | |
| 2015/0131500 A1* | 5/2015 | Xie | G08B 25/007 370/311 |
| 2016/0039301 A1 | 2/2016 | Igarashi et al. | |
| 2016/0233728 A1 | 8/2016 | Park et al. | |
| 2016/0294204 A1* | 10/2016 | Deokar | H02J 7/34 |
| 2017/0194673 A1* | 7/2017 | Jeon | H01M 10/425 |
| 2019/0081518 A1 | 3/2019 | Park et al. | |
| 2019/0252891 A1 | 8/2019 | Ploeg et al. | |
| 2019/0273293 A1 | 9/2019 | Kim et al. | |
| 2019/0356143 A1* | 11/2019 | Lee | H01M 10/4285 |
| 2020/0259374 A1 | 8/2020 | Park et al. | |

FOREIGN PATENT DOCUMENTS

| | | |
|---|---|---|
| CN | 104184183 A | 12/2014 |
| CN | 104253488 A | 12/2014 |
| CN | 104578124 A | 4/2015 |
| CN | 104816813 A | 8/2015 |
| CN | 205335890 U | 6/2016 |
| CN | 105762928 A | 7/2016 |
| CN | 108055249 A | 5/2018 |
| CN | 108461836 A | 8/2018 |
| CN | 109193045 A | 1/2019 |
| CN | 208522051 U | 2/2019 |
| CN | 110024208 A | 7/2019 |
| CN | 110071555 A | 7/2019 |
| CN | 110192303 A | 8/2019 |
| JP | 2012-104039 A | 5/2012 |
| JP | 5642134 B2 | 12/2014 |
| JP | 2016-536959 A | 11/2016 |
| JP | 6424253 B2 | 11/2018 |
| KR | 10-2006-0047052 A | 5/2006 |
| KR | 10-2010-0069917 A | 6/2010 |
| KR | 10-2011-0107724 A | 10/2011 |
| KR | 10-1075352 B1 | 10/2011 |
| KR | 10-2012-0012354 A | 2/2012 |
| KR | 10-2014-0086080 A | 7/2014 |
| KR | 10-1782297 B1 | 11/2017 |
| KR | 10-2019-0099609 A | 8/2019 |
| WO | WO 2014/162648 A1 | 10/2014 |

OTHER PUBLICATIONS

Chinese Office Action 202180003218.0 dated Jan. 5, 2023 is attached.
US Patent Publication No. 2019/0356143 A1 corresponds to CN 110192303-A.
US Patent Publication No. 2014/0347013 A1 corresponds to CN 104184183-A.
US Patent Publication No. 2019/0252891 A1 corresponds to CA 3034856-A1.
International Search Report (PCT/ISA/210) issued in PCT/KR2021/001659, dated May 6, 2021.

* cited by examiner

FIG. 1

Conventional Art

FIG. 2

Conventional Art

APPARATUS AND METHOD FOR PROVIDING BATTERY INFORMATION

TECHNICAL FIELD

The present application claims priority to Korean Patent Application No. 10-2020-0023906 filed on Feb. 26, 2020 in the Republic of Korea, the disclosures of which are incorporated herein by reference.

The present disclosure relates to an apparatus and method for providing battery information capable of providing battery information received from a battery management system.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

In general, in order to optimally manage such a battery, a battery management system (BMS) is provided in a battery pack. The battery management system may diagnose the state of the battery by monitoring voltage, current or the like of the battery. For example, the battery management system may diagnose whether the battery is in an overcharge or overdischarge state. In addition, the battery management system may perform balancing among a plurality of batteries, and may control an operation state of a relay provided in the battery pack.

The battery management system may communicate using a controller area network (CAN) communication protocol or a Modbus TCP communication protocol, and may transmit battery state information and battery diagnosis information (e.g., error information) to a monitoring device.

Here, the CAN communication protocol is a communication protocol that allows the battery management system to transmit battery-related information even if there is no separate request from the monitoring device, since it does not employ a request-response method. Meanwhile, the Modbus TCP communication protocol is a communication protocol that allows the battery management system to transmit corresponding battery-related information only when there is an information request from the monitoring device, since it adopts the request-response method.

Figure 1:
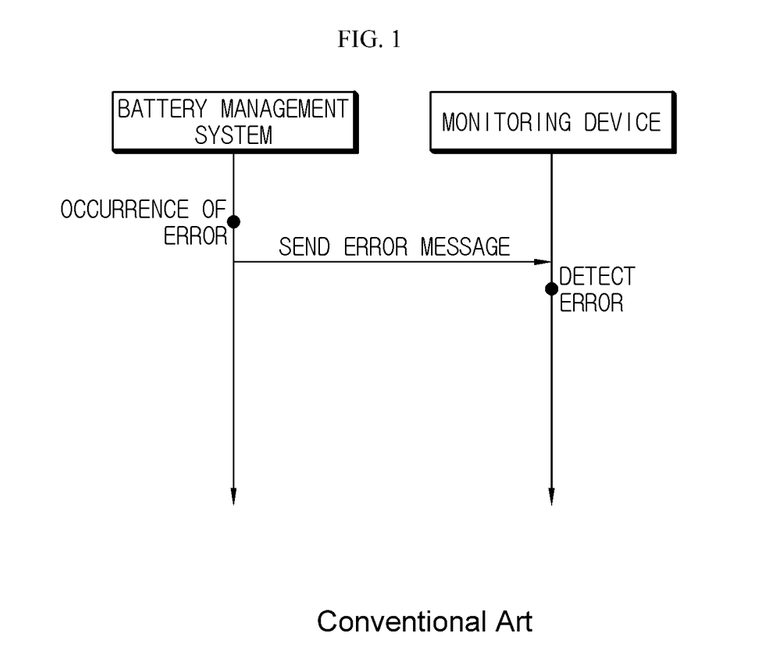
FIG. 1 is a diagram schematically showing an example where a conventional battery management system and a monitoring device make communication using a CAN communication protocol.
Figure 2:
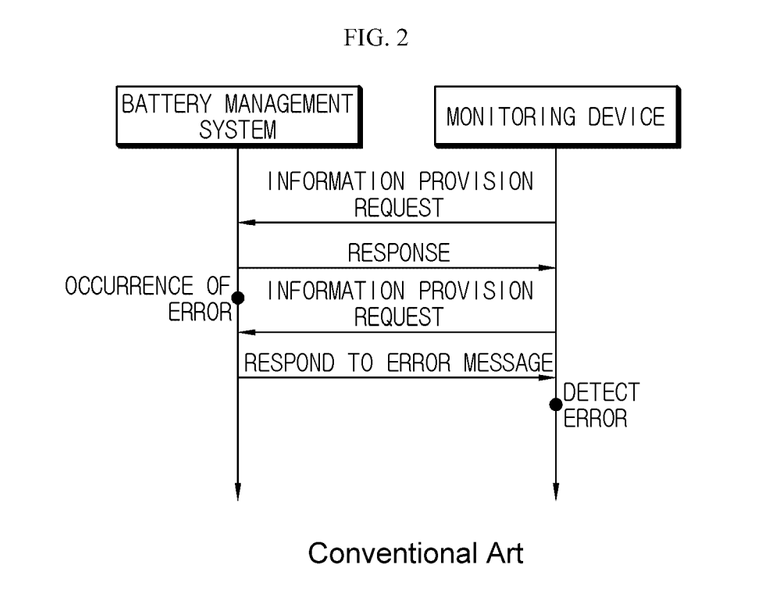
FIG. 2 is a diagram schematically showing an example where a conventional battery management system and a monitoring device make communication using a Modbus TCP communication protocol.

FIG. 1 is a diagram schematically showing an example where a conventional battery management system and a monitoring device make communication using a CAN communication protocol. FIG. 2 is a diagram schematically showing an example where a conventional battery management system and a monitoring device make communication using a Modbus TCP communication protocol.

Referring to FIG. 1, when the battery management system and the monitoring device communicate using the CAN communication protocol, if the battery management system detects an error in the battery, an error message may be transmitted to the monitoring device even if there is no separate request from the monitoring device.

Meanwhile, referring to FIG. 2, if the battery management system and the monitoring device communicate using the Modbus TCP communication protocol, the battery management system may transmit a corresponding response only when there is an information provision request of the monitoring device, so a longer time may be taken for the monitoring device to detect an error, compared to the case of FIG. 1.

Therefore, when communication is performed with the battery management system using only the Modbus TCP communication protocol, there is a problem in that it may be delayed to provide information that is important in real-time response, such as battery diagnosis information.

In addition, in general, the data transmission speed (Mbps, megabits per second) of the CAN communication protocol may be slower than the data transmission speed of the Modbus TCP communication protocol. In this case, if communication is performed with the battery management system using only the CAN communication protocol, there is a problem in that the waste of system resources required for communication of battery state information (e.g., voltage, current, temperature, SOC (State Of Charge) and/or SOH (State Of Health), or the like) may become severe.

DISCLOSURE

Technical Problem

The present disclosure is designed to solve the problems of the related art, and therefore the present disclosure is directed to providing an apparatus and method for providing battery information capable of obtaining battery information from a battery management system using both a CAN communication protocol and a Modbus TCP communication protocol.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for providing battery information, comprising: a first communication unit configured to receive first battery information related to a battery from a battery management system by using a first communication protocol; a second communication unit configured to receive second battery information related to the battery and different from the first battery information from the battery management system by using a second communication protocol different from the first communication protocol; and a data conversion unit connected to the first communication unit and the second communication unit and configured to obtain first conversion information by converting the first battery information into a predetermined data structure, obtain second conversion information by converting the second battery information into the predetermined data structure and output the first conversion information and the second conversion information.

The predetermined data structure may include at least one of a target information field, an identification information field and a value field.

The data conversion unit may be configured to convert the first battery information and the second battery information to correspond to the predetermined data structure.

An apparatus for providing battery information according to another aspect of the present disclosure may further comprise a storage unit configured to receive and store the first conversion information and the second conversion information from the data conversion unit.

The data conversion unit may be configured to store conversion information corresponding to the target information in the storage unit to be associated with each other.

The first communication unit may be configured to receive the first battery information corresponding to an information provision request for the first battery information from the battery management system, only when the information provision request is sent to the battery management system.

The first communication unit may be configured to send the information provision request for the first battery information, at every predetermined cycle or only when there is a request of the data conversion unit.

The second communication unit may be configured to receive the second battery information from the battery management system by using the second communication protocol, even though an information provision request for the second battery information is not sent to the battery management system.

The first battery information may be distinguished from the second battery information based on a capacity and may have a larger capacity than the second battery information.

The first battery information may be battery state information including at least one of voltage, current, temperature, state of charge (SOC) and state of health (SOH) of the battery.

The second battery information may include at least one of battery system information, battery diagnosis information and battery-related control information. The data conversion unit may be configured to send a request for the first battery information corresponding to the second conversion information to the first communication unit, when the identification information of the second conversion information meets a predetermined condition as the battery diagnosis information.

The first communication unit may be configured to send the information provision request for the first battery information to the battery management system, after receiving the request for the first battery information from the data conversion unit.

An apparatus for providing battery information according to further another aspect of the present disclosure may further comprise a decoding unit configured to obtain first decoding information and second decoding information by decoding the first conversion information and the second conversion information, respectively, and output the first decoding information and the second decoding information.

The first communication protocol may be a Modbus TCP communication protocol.

The second communication protocol may be a CAN communication protocol.

In another aspect of the present disclosure, there is also provided a battery pack, comprising the apparatus for providing battery information according to an aspect of the present disclosure.

In another aspect of the present disclosure, there is also provided an energy storage system, comprising the apparatus for providing battery information according to an aspect of the present disclosure.

In another aspect of the present disclosure, there is also provided a method for providing battery information, comprising: a first receiving step of receiving first battery information related to a battery from a battery management system by using a first communication protocol; a second receiving step of receiving second battery information related to the battery from the battery management system by using a second communication protocol different from the first communication protocol, in parallel to the first receiving step, the second battery information being different from the first battery information; a data conversion step of obtaining first conversion information by converting the first battery information into a predetermined data structure and obtaining second conversion information by converting the second battery information into the predetermined data structure; and a data output step of outputting the first conversion information and the second conversion information.

Advantageous Effects

According to an aspect of the present disclosure, by receiving battery-related information from a battery management system using both a first communication protocol with high communication efficiency for the first battery information and a second communication protocol with high communication efficiency for the second battery information, system resources required for data communication may be used efficiently.

In addition, according to an aspect of the present disclosure, battery information received through different communication protocols are converted into the same data structure and then stored in association, thereby making it easier to manage and process battery-related information.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 3 is a diagram schematically showing an apparatus for providing battery information according to an embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 4:
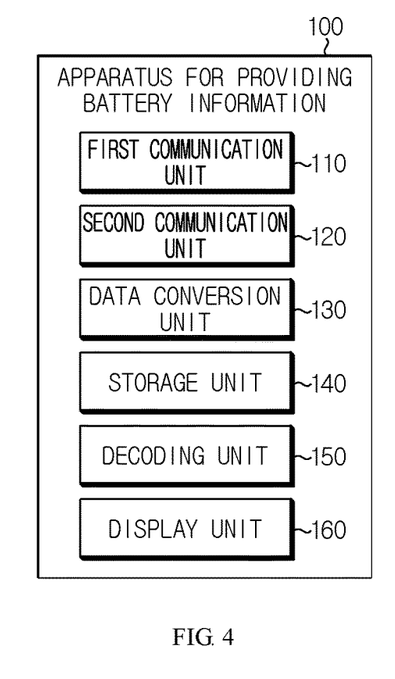
FIG. 4 is a diagram schematically showing a connection configuration of the apparatus for providing battery information according to an embodiment of the present disclosure and a battery management system.

FIG. 3 is a diagram schematically showing an apparatus for providing battery information 100 according to an embodiment of the present disclosure. FIG. 4 is a diagram schematically showing a connection configuration of the apparatus for providing battery information 100 according to an embodiment of the present disclosure and a battery management system 200.

Referring to FIG. 3, the apparatus for providing battery information 100 according to an embodiment of the present disclosure may include a first communication unit 110, a second communication unit 120, and a data conversion unit 130.

The first communication unit 110 may be configured to receive first battery information related to a battery from the battery management system 200 by using a first communication protocol.

Here, the first communication protocol is a communication protocol for data communication between the first communication unit 110 and the battery management system 200. For example, the first communication protocol may be a Modbus TCP communication protocol.

For example, in the embodiment of FIG. 4, the battery management system 200 and the first communication unit 110 may be connected to each other. Here, the battery management system 200 and the first communication unit 110 may be connected by wire and/or wirelessly, and data communication may be performed using the first communication protocol.

The second communication unit 120 may be configured to receive second battery information related to the battery and different from the first battery information from the battery management system 200 by using a second communication protocol different from the first communication protocol.

Here, the second communication protocol is a communication protocol for data communication between the second communication unit 120 and the battery management system 200. In addition, the second communication protocol is a communication protocol different from the first communication protocol. For example, the second communication protocol may be a CAN communication protocol.

For example, in the embodiment of FIG. 4, the battery management system 200 and the second communication unit 120 may be connected to each other. Here, the battery management system 200 and the second communication unit 120 may be connected by wire and/or wirelessly, and data communication may be performed using the second communication protocol.

In addition, the second battery information that the second communication unit 120 receives from the battery management system 200 may be information different from the first battery information that the first communication unit 110 receives from the battery management system 200. That is, the first communication unit 110 and the second communication unit 120 may be configured to receive battery information optimized for the applied communication protocol from the battery management system 200, respectively.

The data conversion unit 130 may be configured to be connected to the first communication unit 110 and the second communication unit 120.

Specifically, the data conversion unit 130 may be connected to enable communication with both the first communication unit 110 and the second communication unit 120.

For example, in the embodiment of FIG. 4, the data conversion unit 130 may be connected to the first communication unit 110 and the second communication unit 120. In addition, the data conversion unit 130 may receive the first battery information from the first communication unit 110 and receive the second battery information from the second communication unit 120.

The data conversion unit 130 may be configured to obtain first conversion information by converting the first battery information into a predetermined data structure.

Specifically, the data conversion unit 130 may obtain the first conversion information by converting the first battery information received from the first communication unit 110 to correspond to a predetermined data structure.

In addition, the data conversion unit 130 may be configured to obtain second conversion information by converting the second battery information into the predetermined data structure.

Specifically, the data conversion unit 130 may obtain the second conversion information by converting the second battery information received from the second communication unit 120 to correspond to the predetermined data structure.

That is, the data conversion unit 130 may convert the first battery information received from the first communication unit 110 and the second battery information received from the second communication unit 120 into information having the same data structure.

Therefore, since the first battery information received by the first communication unit 110 from the battery management system using the first communication protocol and the second battery information received by the second communication unit 120 from the battery management system using the second communication protocol are converted by the data conversion unit 130 to have the same data structure, the data format may be unified.

The data conversion unit 130 may be configured to output the first conversion information and the second conversion information.

For example, the data conversion unit 130 may output and store the first conversion information and the second conversion information having the same data structure.

That is, the data conversion unit 130 may convert the first battery information and the second battery information having different data structures into the first conversion information and the second conversion information having the same data structure and then output them.

Therefore, the apparatus for providing battery information 100 according to an embodiment of the present disclosure may receive battery-related information from the battery management system 200 by using both the first communication protocol with high communication efficiency for the first battery information and the second communication protocol with high communication efficiency for the second battery information.

In addition, since the apparatus for providing battery information 100 may convert the first battery information and the second battery information into the same data structure, the battery information respectively received using the first communication protocol and the second communication protocol may be integrally managed.

Meanwhile, the data conversion unit 130 provided to the apparatus for providing battery information 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the data conversion unit 130 may be implemented as a set of program modules. At this time, the program module may be stored in a memory and executed by the data conversion unit 130. The memory may be located inside or out of the data conversion unit 130 and may be connected to the data conversion unit 130 by various well-known means.

Figure 5:
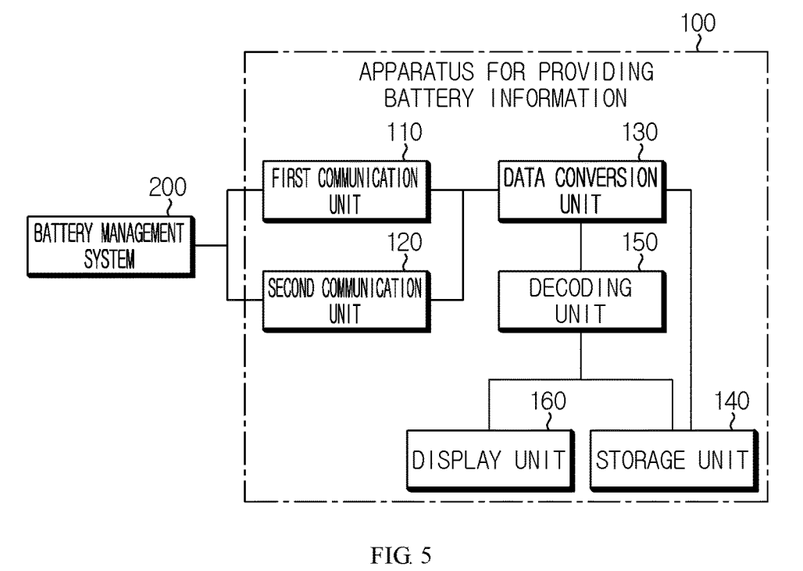
FIG. 5 is a diagram schematically showing a data structure of conversion information, which is converted by the apparatus for providing battery information according to an embodiment of the present disclosure.

FIG. 5 is a diagram schematically showing a data structure of conversion information, which is converted by the apparatus for providing battery information 100 according to an embodiment of the present disclosure.

Referring to FIG. 5, the predetermined data structure may be configured as a structure including at least one of a target information field 131, an identification information field 132, and a battery information value field 133.

The target information may be information for identifying a battery that is a target of the battery information received from the battery management system 200. In addition, the target information field 131 may be a data space in which the target information may be included.

For example, the target information may include an ID of a battery cell, an ID of a battery module, an ID of a battery rack, or the like. Specifically, the target information may include a first battery cell, a second battery cell, a first battery module, a second battery module, a first battery rack, a second battery rack, or the like.

Here, the battery cell refers to one independent cell that includes a negative electrode terminal and a positive electrode terminal and is physically separable. For example, one pouch-type lithium polymer cell may be regarded as a battery cell. In addition, the battery module refers to a cell assembly in which one or more battery cells are connected in series and/or in parallel. In addition, the battery rack refers to a cell assembly including one or more battery modules in a housing.

The identification information may be information indicating a classification item of the battery information received from the battery management system 200. In addition, the identification information field 132 may be a data space in which the identification information may be included.

For example, the identification information may include battery state information, battery diagnosis information, battery system information, battery-related control information, or the like.

The value of the battery information may be information indicating contents of the battery information received from the battery management system 200. In addition, the value field 133 may be a data space in which the value of the battery information may be included.

For example, the value of the battery information may include a current value, a voltage value, a temperature value, an SOC, an SOH, or the like, which indicates state information of the battery, and may include battery diagnosis state information such as an overcharge state or an overdischarge state. In addition, the battery information value may include detailed contents of the battery system information and the battery-related control information.

In addition, although only the target information field 131, the identification information field 132 and the value field 133 are included in the data structure of FIG. 5, it should be noted that various fields for the battery information such as a field indicating a storage location of the battery information and a field indicating the size of battery information may be further included.

The data conversion unit 130 may be configured to convert the first battery information and the second battery information to correspond to the predetermined data structure.

The data structure of the first battery information received using the first communication protocol and the second battery information received using the second communication protocol from the battery management system 200 may be different from each other. Accordingly, the apparatus for providing battery information 100 has an advantage of integrally managing the first conversion information and the second conversion information by converting the first battery information and the second battery information into a common data format (the predetermined data structure).

That is, the apparatus for providing battery information 100 has an advantage of more easily managing the battery information received using a plurality of different communication protocols since it manages the first battery information and the second battery information using a unified data structure, without converting and managing the first battery information and the second battery information into different data structures.

The apparatus for providing battery information 100 according to an embodiment of the present disclosure may further include a storage unit 140 configured to receive and store the first conversion information and the second conversion information from the data conversion unit 130.

For example, in the embodiments of FIGS. 3 and 4, the storage unit 140 may be further included in the apparatus for providing battery information 100. In addition, the storage unit 140 may be connected to the data conversion unit 130 to store the first conversion information and the second conversion information output from the data conversion unit 130.

Here, the storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the data conversion unit 130 are defined.

The data conversion unit 130 may be configured to store conversion information corresponding to the target information to be associated with each other in the storage unit 140.

Specifically, the data conversion unit 130 may check the target information included in the target information field 131 of the first conversion information, check the target information included in the target information field 131 of the second conversion information, and store conversion information including the same target information to be associated with each other in the storage unit 140.

For example, it is assumed that the target information included in the target information field 131 of the first conversion information is the first battery cell, and the target information included in the target information field 131 of the second conversion information is the first battery cell. The data conversion unit 130 may store the first conversion information and the second conversion information including the first battery cell, which is common target information, to be associated with each other in the storage unit 140.

Accordingly, since the battery information received through different communication protocols is converted into the same data structure and then stored to be associated with each other, battery-related information may be managed and processed more easily.

The first communication unit 110 may be configured to receive the first battery information corresponding to the information provision request from the battery management system 200, only when an information provision request for the first battery information is sent to the battery management system 200.

Specifically, the first communication unit 110 may send an information provision request for the first battery information to the battery management system 200 by using the first communication protocol. After that, the first communication unit 110 may receive the first battery information from the battery management system 200 by using the first communication protocol.

For example, the first communication protocol may be a communication protocol employing a request-response method such as Modbus TCP communication protocol.

In the information provision request sent by the first communication unit 110, the target information and the identification information for the first battery information may be designated. That is, the first communication unit 110 may send the information provision request for the first battery information to the battery management system 200 after designating the target information and the identification information of the first battery information that is a target of the information provision request.

For example, when the first communication unit 110 intends to receive the voltage information for the first battery cell, the information provision request sent by the first communication unit 110 to the battery management system 200 may include the first battery cell as the target information and include the voltage information as the identification information. After that, the first communication unit 110 may receive the first battery information from the battery management system, and the data conversion unit 130 may convert the first battery information into first conversion information. In this case, the target information field 131 of the first conversion information may include "first battery cell", the identification information field 132 may include "voltage information", and the value field 133 may include the voltage value of, for example, "3.8 [V]".

Preferably, the first communication unit 110 may be configured to send the information provision request for the first battery information at every predetermined cycle or only when there is a request from the data conversion unit 130.

Specifically, the first communication unit 110 may send the information provision request for the first battery information to the battery management system 200 at every predetermined cycle, and receive the first battery information as a response thereto.

In addition, even when there is a request from the data conversion unit 130, the first communication unit 110 may send the information provision request for the first battery information to the battery management system 200, and receive the first battery information as a response thereto. In this case, the target information and the identification information included in the first battery information may be designated by the data conversion unit 130.

Meanwhile, the second communication unit 120 may be configured to receive the second battery information from the battery management system 200 by using the second communication protocol even if the information provision request for the second battery information is not sent to the battery management system 200.

For example, the second communication protocol may be a communication protocol that does not employ a request-response method, such as a CAN communication protocol.

Accordingly, the second communication unit 120 may receive the second battery information from the battery management system 200 even if a separate information provision request for the second battery information is not sent to the battery management system 200.

The first battery information and the second battery information may be classified in consideration of whether or not the information requires real-time processing. Here, whether real-time processing is required may be set according to whether it is required that the process until the battery information obtained by the battery management system 200 is provided to the apparatus for providing battery information 100 should be performed in real time.

Preferably, the first battery information may have a lower demand for real-time processing than the second battery information. That is, the second battery information may be information that should be sent to the apparatus for providing battery information 100 immediately after being obtained by the battery management system 200, even if there is no separate request.

For example, the first battery information may be battery state information including at least one of voltage, current, temperature, SOC and SOH of the battery.

In addition, the second battery information may include at least one of battery system information, battery diagnosis information and battery-related control information.

The battery system information may be information provided when the battery management system 200 and the apparatus for providing battery information 100 are connected first. For example, the battery system information may include information on the battery management system 200 such as manufacturing date of the battery management system 200, serial number, software version, hardware version, the number of battery racks in operation, the number of battery modules in operation, the number of battery cells in operation, and the type of battery cells.

The battery diagnosis information may be diagnosis information on a battery (a battery rack, a battery module and/or a battery cell) operating in the battery management system 200. For example, the battery diagnosis information may include information indicating battery states such as a normal state, a high voltage state, a low voltage state, an overcharge state, an overdischarge state, a high temperature state and a low temperature state.

The battery-related control information may be control command information for the battery management system 200 or control command information by the battery management system 200. For example, the battery-related control information may include control command information for the battery management system 200 such as a start command information, an end command information and a standby command information for the battery management system 200, and control command information by the battery management system 200 such as an air conditioner operation command and a relay operation state switching command.

The second battery information (battery system information, battery diagnosis information, and battery-related control information) has a smaller capacity than the first battery information (battery state information), but requires real-time processing.

For example, referring to FIGS. 1 and 2, the battery diagnosis information such as error information is information that should be provided to the apparatus for providing battery information 100 as soon as it is checked by the battery management system 200. Accordingly, the apparatus for providing battery information 100 may receive the second battery information from the battery management system 200 by using the second communication protocol.

Meanwhile, the battery state information such as battery voltage information is information that is unlikely to cause a fatal defect even if the battery management system 200 checks it only when there is an information provision request. Also, in general, the capacity of the first battery information may be greater than the capacity of the second battery information.

Therefore, if the first battery information having a relatively larger capacity than the second battery information and not necessarily requiring real-time processing makes communication by using the second communication protocol, system resources for communication between the battery management system 200 and the apparatus for providing battery information 100 may be wasted. To solve this problem, the apparatus for providing battery information 100 may receive the first battery information from the battery management system 200 by using the first communication protocol.

That is, the apparatus for providing battery information 100 according to an embodiment of the present disclosure has an advantage of creating an optimized communication environment for each of the first battery information and the second battery information by communicating with the battery management system 200 through a plurality of communication protocols.

The first battery information may be configured to be distinguished from the second battery information based on capacity. For example, the first battery information may be configured to have a larger capacity than the second battery information.

Specifically, the first battery information and the second battery information may be configured to be distinguished according to a data transmission speed of the second communication protocol. That is, the first battery information and the second battery information may be distinguished based on data transmission capacity per second of the second communication protocol.

The data transmission speed of the first communication protocol may be faster than the data transmission speed of the second communication protocol. For example, the data transmission speed of the first communication protocol may be 100 Mbps at maximum, and the data transmission speed of the second communication protocol may be 1 Mbps at maximum.

Preferably, the capacity of the first battery information may be greater than the capacity of the second battery information, smaller than the data transmission capacity per second (e.g., 100 Mbit) of the first communication protocol, and greater than the data transmission capacity per second (e.g., 1 Mbit) of the second communication protocol. In addition, the capacity of the second battery information may be smaller than the data transmission capacity per second (e.g., 1 Mbit) of the second communication protocol.

For example, it is assumed that the battery management system 200 is connected to 15,000 battery cells. The battery management system 200 may send the first battery information including voltage information, current information and temperature information of each of 15,000 battery cells to the apparatus for providing battery information 100. In addition, it is assumed that each of the voltage information, the current information and the temperature information has a size of 32 bits (4 bytes). In this case, the capacity of the first battery information sent by the battery management system 200 may be 1.44 Mbit (32 bit×3×15,000).

In the above example, if the battery management system 200 sends the first battery information to the apparatus for providing battery information 100 by using the second communication protocol, there may be a problem in that all of the first battery information cannot be sent at once. That is, since the data transmission capacity per second (e.g., 1 Mbit) of the second communication protocol is smaller than the capacity of the first battery information (e.g., 1.44 Mbit), the battery management system 200 should send the first battery information to the apparatus for providing battery information 100 in twice by using the second communication protocol. Therefore, unless the first battery information and the second battery information, which may be distinguished according to capacity, are sent to the apparatus for providing battery information 100 using different communication protocols respectively corresponding thereto, system resources for communication may be severely wasted.

The apparatus for providing battery information 100 according to an embodiment of the present disclosure may classify the first battery information and the second battery information according to capacity in consideration of the data transmission speed of the first communication protocol and the data transmission speed of the second communication protocol. Accordingly, the apparatus for providing battery information 100 may perform efficient communication by receiving the first battery information and the second battery information from the battery management system 200 by using communication protocols respectively corresponding thereto. Therefore, system resources required for communication between the battery management system 200 and the apparatus for providing battery information 100 may be efficiently utilized, thereby preventing the system resources from being wasted.

Figure 6:
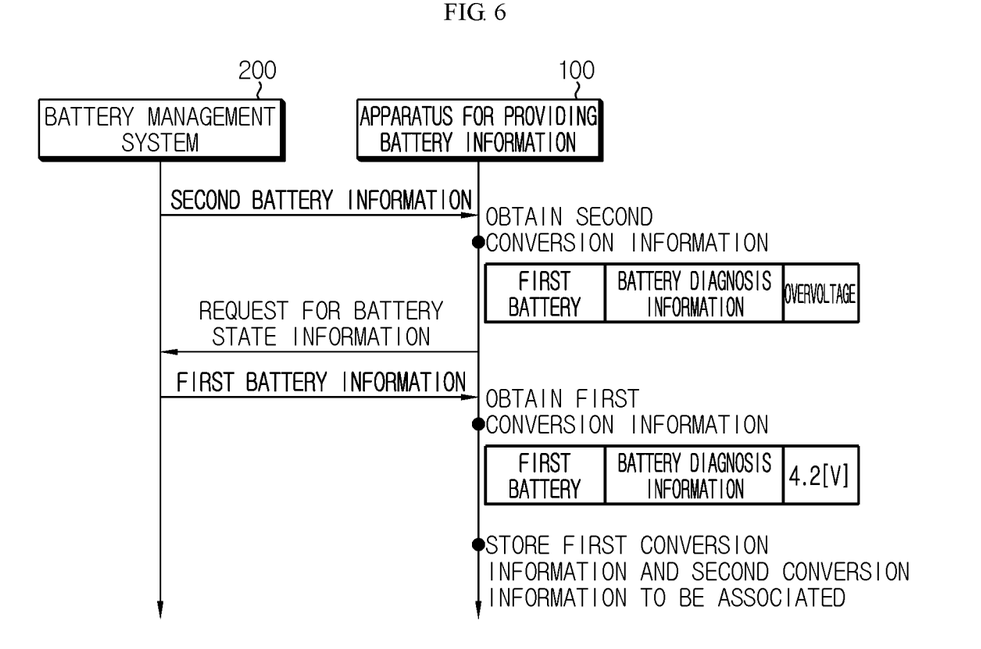
FIG. 6 is a diagram schematically showing an example of a communication process of the apparatus for providing battery information according to an embodiment of the present disclosure and the battery management system.

FIG. 6 is a diagram schematically showing an example of a communication process of the apparatus for providing battery information 100 according to an embodiment of the present disclosure and the battery management system 200.

The data conversion unit 130 may be configured to send a request for the first battery information corresponding to the second conversion information to the first communication unit 110, if the identification information of the second conversion information meets a predetermined condition as the battery diagnosis information.

Specifically, if the identification information of the second conversion information is the battery diagnosis information, the data conversion unit 130 may check the value of the battery information included in the value field 133 of the second conversion information. If the value of the battery information of the second conversion information does not indicate a normal state, the data conversion unit 130 may determine that the predetermined condition is met.

That is, if the identification information of the second conversion information is the battery diagnosis information and the value of the battery information is not a normal state, the data conversion unit 130 may send a request for the first battery information to the first communication unit 110. Specifically, the data conversion unit 130 may send a request for first battery information corresponding to the value of the battery information of the second conversion information to the first communication unit 110.

For example, in the embodiment of FIG. 6, the target information of the second conversion information may be "first battery", the identification information may be "battery diagnosis information", and the value of the battery information may be "overvoltage". Even though the identification information of the second conversion information is "battery diagnosis information", since the value of the battery information is not "normal state", the data conversion unit 130 may send a request for the first battery information corresponding to "overvoltage (the value of the battery information of the second conversion information)" to the first communication unit 110.

The first communication unit 110 may be configured to send an information provision request for the first battery information to the battery management system 200 after receiving the request for the first battery information from the data conversion unit 130.

The request for the first battery information received from the data conversion unit 130 by the first communication unit 110 may include the target information and the identification information, which should be included in the first battery information. Here, the identification information may be information corresponding to the value of the battery information of the second conversion information.

For example, in the embodiment of FIG. 6, the request for the first battery information sent to the first communication unit 110 by the data conversion unit 130 may include the voltage information of the first battery.

In another embodiment, if "overcurrent" is included in the value of the battery information of the second conversion information, the request for the first battery information sent to the first communication unit 110 by the data conversion unit 130 may include the current information of the first battery.

In still another embodiment, if "high temperature" is included in the value of the battery information of the second conversion information, the request for the first battery information sent to the first communication unit 110 by the data conversion unit 130 may include the temperature information of the first battery.

After that, if the first communication unit 110 receives the first battery information from the battery management system 200, the data conversion unit 130 may obtain the first conversion information by receiving the first battery information from the first communication unit 110.

For example, in the embodiment of FIG. 6, the first conversion information may include "first battery" as the target information, include "battery state information (specifically, battery voltage information)" as the identification information, and include "4.2 [V]" as the value of the battery information.

After that, the data conversion unit 130 may store the first conversion information and the second conversion information with the same target information as "first battery" in the storage unit 140 to be associated with each other.

Through this process, the apparatus for providing battery information 100 according to an embodiment of the present disclosure may determine the first battery information, which is to be requested to be provided to the battery management system 200, based on the second battery information received in advance. Accordingly, since the first battery information and the second battery information related to each other are stored in association with each other, battery-related information may be managed more efficiently.

The apparatus for providing battery information 100 according to an embodiment of the present disclosure may further include a decoding unit 150 configured to obtain first decoding information and second decoding information by decoding the first conversion information and the second conversion information, respectively.

Here, the decoding information refers to information obtained by decoding the conversion information into characters, symbols, numbers and/or figures to be provided to a user.

Referring to FIGS. 3 and 4, the apparatus for providing battery information 100 may further include a decoding unit 150, and the decoding unit 150 may be communicatively connected to the data conversion unit 130. The decoding unit 150 may receive at least one of the first conversion information and the second conversion information output from the data conversion unit 130 and decode the received conversion information to obtain first decoding information and/or second decoding information.

For example, in the embodiment of FIG. 6, for convenience of explanation, it is shown that the second conversion information includes "first battery" as the target information, "battery diagnosis information" as the identification information, and "overvoltage" as the value of the battery information. However, in fact, the conversion information may take the form of a system code used in the apparatus for providing battery information 100. For example, the conversion information may include a hexadecimal system code such as 0x01, 0xD431, and 0x31.

That is, the decoding unit 150 may obtain decoding information, which may be checked by a user, by decoding a system code included in the conversion information.

The decoding unit 150 may be configured to output the first decoding information and the second decoding information.

For example, in the embodiment of FIG. 4, the decoding unit 150 may be communicatively connected with the storage unit 140. In addition, the decoding unit 150 may output the first decoding information and the second decoding information to be stored in the storage unit 140. Preferably, like the data conversion unit 130, the decoding unit 150 may store the decoding information having the same target information to be associated with each other.

Referring to FIGS. 3 and 4 further, the apparatus for providing battery information 100 according to an embodiment of the present disclosure may further include a display unit 160.

The display unit 160 may be communicatively connected to the decoding unit 150. The display unit 160 may be configured to receive the first decoding information and the second decoding information output from the decoding unit 150, and output the received first decoding information and the received second decoding information through a provided display screen or the like. Preferably, the display unit 160 may output the decoding information having the same target information to be associated with each other. Through this, the user may easily check the first decoding information and the second decoding information related to each other.

A battery pack 1 according to another embodiment of the present disclosure may include the apparatus for providing battery information 100 according to an embodiment of the present disclosure.

Figure 7:
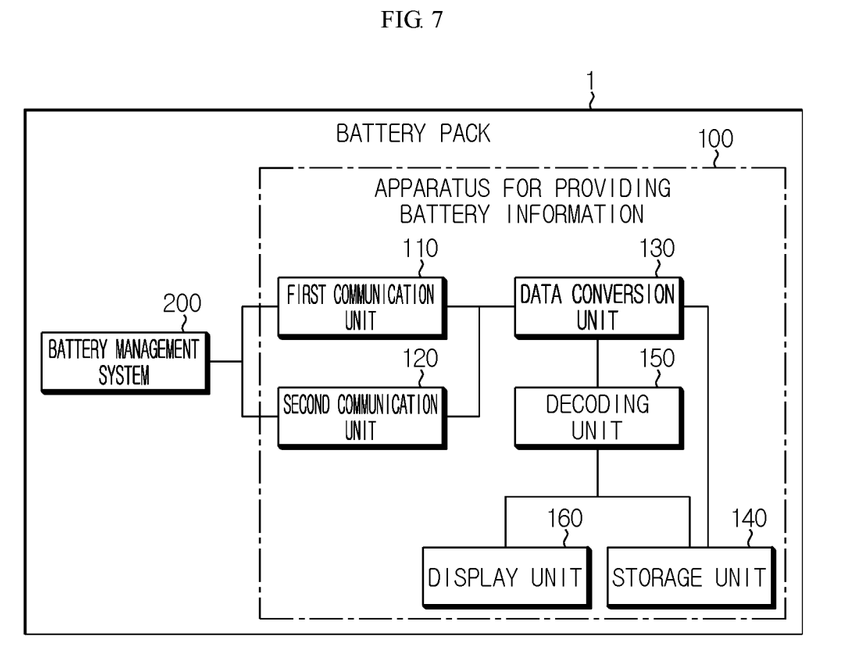
FIGS. 7 and 8 are diagrams schematically showing a battery pack including the apparatus for providing battery information according to an embodiment of the present disclosure.
Figure 8:
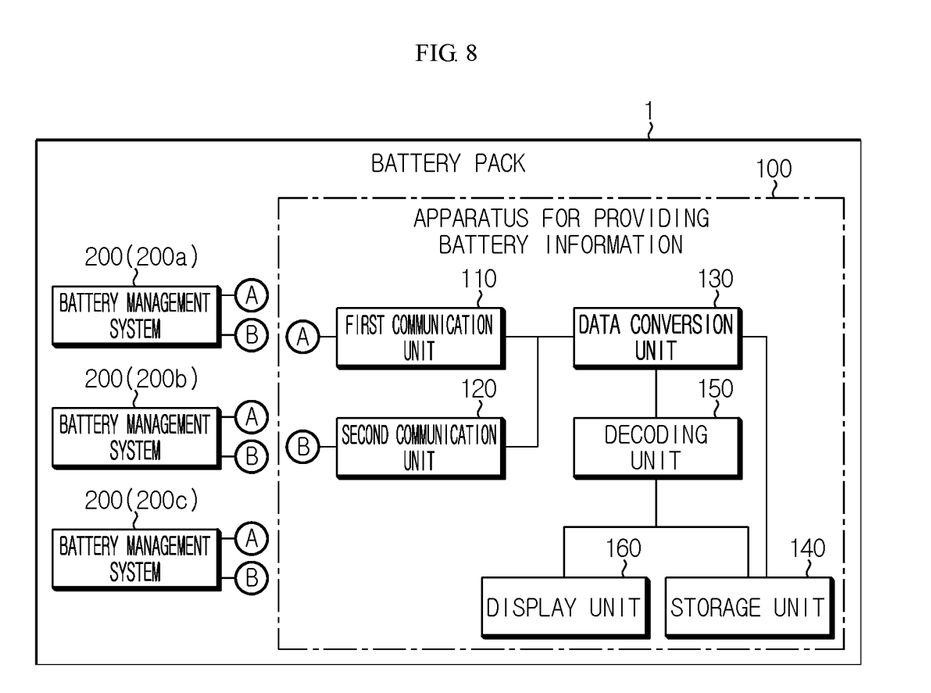

FIGS. 7 and 8 are diagrams schematically showing a battery pack 1 including the apparatus for providing battery information 100 according to an embodiment of the present disclosure.

Specifically, FIG. 7 is a diagram schematically showing a battery pack 1 including one battery management system 200, and FIG. 8 is a diagram schematically showing a battery pack 1 including a plurality of battery management systems 200a, 200b, 200c.

Preferably, the battery management system 200 may be configured to output the battery information by using both the first communication protocol and the second communication protocol. Accordingly, the battery management system 200 may be connected to the first communication unit 110 and the second communication unit 120 of the apparatus for providing battery information 100.

For example, if only the first communication protocol is available and the second communication protocol is not available, when the battery management system 200 is provided in the battery pack 1, the battery management system 200 may be connected only to the first communication unit 110.

In addition, although not shown in FIGS. 7 and 8, the battery pack 1 according to the present disclosure may include at least one battery cell. In addition, the battery pack 1 may further include electrical equipment (a relay, a fuse, etc.) and a case.

An energy storage system (ESS) 2 according to another embodiment of the present disclosure may include the apparatus for providing battery information 100 according to an embodiment of the present disclosure.

Figure 9:
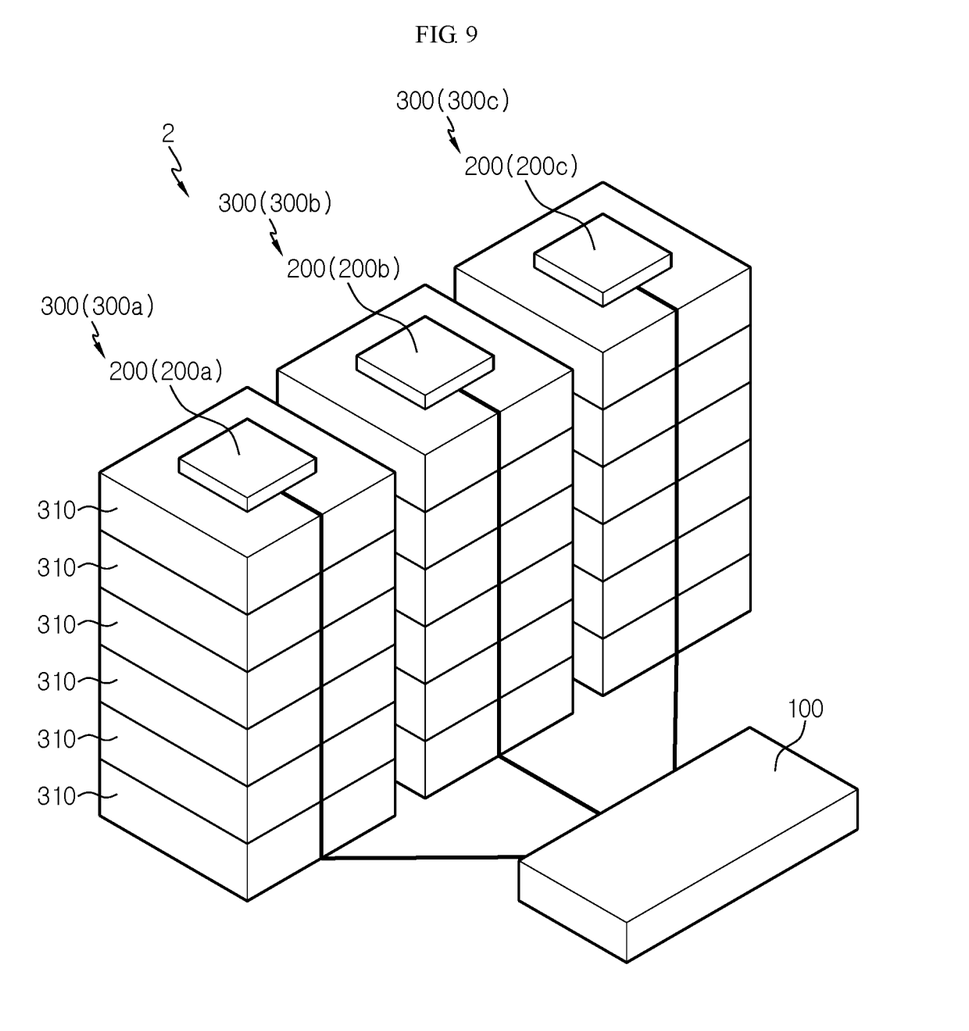
FIG. 9 is a diagram schematically showing an energy storage system including the apparatus for providing battery information according to an embodiment of the present disclosure.

FIG. 9 is a diagram schematically showing an energy storage system 2 including the apparatus for providing battery information 100 according to an embodiment of the present disclosure.

Referring to FIG. 9, the energy storage system 2 may include a plurality of battery racks 300a, 300b, 300c, a plurality of battery management systems 200a, 200b, 200c, and the apparatus for providing battery information 100.

For example, the battery rack 300 may be a cell assembly in which one or more battery modules 310 are mounted on a predetermined frame structure. In addition, the battery management system 200 may be provided to each of the plurality of battery racks 300a, 300b, 300c.

In addition, the plurality of battery management systems 200a, 200b, 200c may be connected to the apparatus for providing battery information 100. However, it should be noted that although FIG. 9 shows an example in which the battery management system 200 and the apparatus for providing battery information 100 are connected by wire, the battery management system 200 and the apparatus for providing battery information 100 may be connected through wireless communication.

The apparatus for providing battery information 100 may be configured to communicate with the battery management system 200 provided in the battery rack 300 by using the first communication unit 110 and the second communication unit 120.

Therefore, there is an advantage in that information related to the battery rack 300 may be efficiently communicated by using a plurality of communication protocols.

Figure 10:
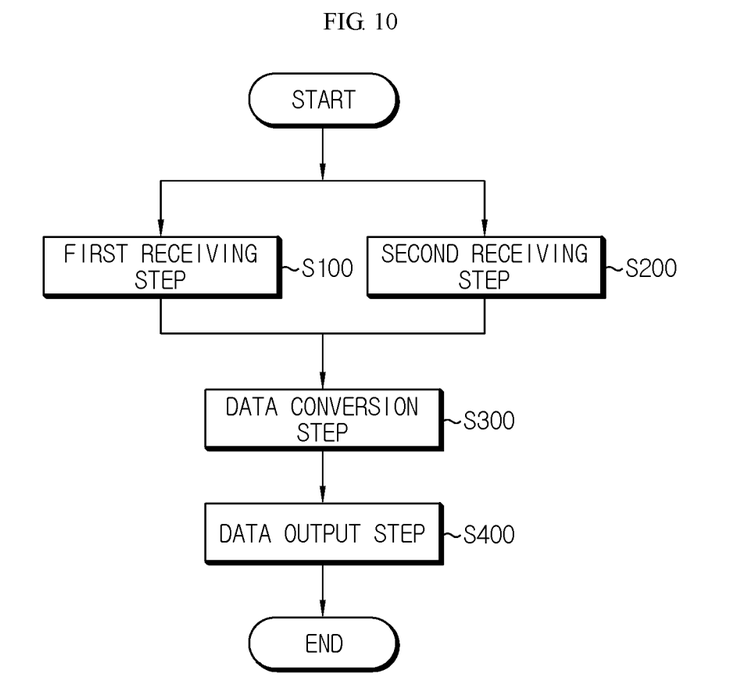
FIG. 10 is a diagram schematically showing a method for providing battery information according to another embodiment of the present disclosure.

FIG. 10 is a diagram schematically showing a method for providing battery information according to another embodiment of the present disclosure.

Here, the method for providing battery information may be performed by the apparatus for providing battery information 100.

Hereinafter, it should be noted that contents overlapping with the above description will be briefly described.

Referring to FIG. 10, the method for providing battery information according to another embodiment of the present disclosure includes a first receiving step (S100), a second receiving step (S200), a data conversion step (S300), and a data output step (S400).

The first receiving step (S100) is a step of receiving first battery information related to a battery from the battery management system 200 by using a first communication protocol, and may be performed by the first communication unit 110.

The second receiving step (S200) is a step of receiving second battery information related to the battery and different from the first battery information from the battery management system 200 by using a second communication protocol different from the first communication protocol, and may be performed by the second communication unit 120.

In addition, the second receiving step (S200) is a step in parallel with the first receiving step (S100). That is, the second receiving step S200 may be performed at the same time as the first receiving step S100 or may be performed at different time points.

The data conversion step (S300) is a step of converting the first battery information into a predetermined data structure to obtain first conversion information and converting the second battery information into the predetermined data structure to obtain second conversion information, and may be performed by the data conversion unit 130.

Referring to FIG. 4, the data conversion unit 130 may be connected to the first communication unit 110 and the second communication unit 120. The data conversion unit 130 may receive the first battery information from the first communication unit 110 and receive the second battery information from the second communication unit 120. In addition, the data conversion unit 130 may convert the first battery information and the second battery information into the same data structure to obtain first conversion information from the first battery information and obtain second conversion information from the second battery information.

The data output step S400 is a step of outputting the first conversion information and the second conversion information, and may be performed by the data conversion unit 130.

Referring to FIG. 4, the data conversion unit 130 may be connected to the decoding unit 150 and the storage unit 140.

The data conversion unit 130 may output the first conversion information and the second conversion information to the storage unit 140 to store the first conversion information and the second conversion information. Preferably, the data conversion unit 130 may store the conversion information having the same target information to be associated with each other.

In addition, the data conversion unit 130 may output the first conversion information and the second conversion information to the decoding unit 150. The decoding unit 150 may receive the first conversion information and the second conversion information, obtain first decoding information by decoding the first conversion information, and obtain second decoding information by decoding the second conversion information. In addition, the decoding unit 150 may output the first decoding information and the second decoding information to the display unit 160 and/or the storage unit 140.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
2: energy storage system
100: apparatus for providing battery information
110: first communication unit
120: second communication unit
130: data conversion unit
131: target information field
132: identification information field
133: value field
140: storage unit
150: decoding unit
160: display unit
200: battery management system
300: battery rack
310: battery module

What is claimed is:

1. An apparatus for providing battery information, comprising:
   a first communication unit configured to receive first battery information related to a battery from a battery management system by using a first communication protocol;
   a second communication unit configured to receive second battery information related to the battery and different from the first battery information from the battery management system by using a second communication protocol different from the first communication protocol; and
   a data conversion unit connected to the first communication unit and the second communication unit and configured to:
   obtain first conversion information by converting the first battery information into a predetermined data structure,
   obtain second conversion information by converting the second battery information into the predetermined data structure, and
   output the first conversion information and the second conversion information,
   wherein the first communication protocol employs a request-response method,
   wherein the second communication protocol does not employ a request-response method,
   wherein the predetermined data structure of the first conversion information is in a same structure as the predetermined data structure of the second conversion information, and
   wherein the predetermined data structure of the first conversion information and the predetermined data structure of the second conversion information include a battery information value.

2. The apparatus for providing battery information according to claim 1,
   wherein the predetermined data structure includes at least one of a target information field, an identification information field and a value field, and
   wherein the data conversion unit is configured to convert the first battery information and the second battery information to correspond to the predetermined data structure.

3. The apparatus for providing battery information according to claim 2, further comprising:
   a storage unit configured to receive and store the first conversion information and the second conversion information from the data conversion unit,
   wherein the data conversion unit is configured to store conversion information corresponding to the target information in the storage unit to be associated with each other.

4. The apparatus for providing battery information according to claim 2, wherein the first communication unit is configured to receive the first battery information corresponding to an information provision request for the first battery information from the battery management system, only when the information provision request is sent to the battery management system.

5. The apparatus for providing battery information according to claim 4,
wherein the first communication unit is configured to send the information provision request for the first battery information, at every predetermined cycle or only when there is a request of the data conversion unit.

6. The apparatus for providing battery information according to claim 4,
wherein the second communication unit is configured to receive the second battery information from the battery management system by using the second communication protocol, even though an information provision request for the second battery information is not sent to the battery management system.

7. The apparatus for providing battery information according to claim 4,
wherein the first battery information is distinguished from the second battery information based on a capacity and has a larger capacity than the second battery information.

8. The apparatus for providing battery information according to claim 4, wherein the first battery information is battery state information including at least one of voltage, current, temperature, state of charge (SOC) and state of health (SOH) of the battery,
wherein the second battery information includes at least one of battery system information, battery diagnosis information and battery-related control information, and
wherein the data conversion unit is configured to send a request for the first battery information corresponding to the second conversion information to the first communication unit, when the identification information of the second conversion information meets a predetermined condition as the battery diagnosis information.

9. The apparatus for providing battery information according to claim 8,
wherein the first communication unit is configured to send the information provision request for the first battery information to the battery management system, after receiving the request for the first battery information from the data conversion unit.

10. The apparatus for providing battery information according to claim 1, wherein the first battery information is different from the second battery information, and
wherein the first battery information is battery state information including at least one of voltage, current, temperature, state of charge (SOC) and state of health (SOH) of the battery.

11. The apparatus for providing battery information according to claim 10,
wherein the second battery information includes at least one of battery system information, battery diagnosis information and battery-related control information.

12. The apparatus for providing battery information according to claim 1, further comprising:
a decoding unit configured to obtain first decoding information and second decoding information by decoding the first conversion information and the second conversion information, respectively, and output the first decoding information and the second decoding information.

13. A battery pack, comprising the apparatus for providing battery information according to claim 1.

14. An energy storage system, comprising the apparatus for providing battery information according to claim 1.

15. The apparatus for providing battery information according to claim 1, wherein the request-response method of the first communication protocol includes:
sending an information provision request, by the first communication unit; and
receiving the first battery information from the battery management system.

16. The apparatus for providing battery information according to claim 1, wherein the first battery information has a lower demand for real-time processing than the second battery information.

17. A method for providing battery information, comprising:
a first receiving step of receiving first battery information related to a battery from a battery management system by using a first communication protocol;
a second receiving step of receiving second battery information related to the battery from the battery management system by using a second communication protocol different from the first communication protocol, in parallel to the first receiving step, the second battery information being different from the first battery information;
a data conversion step of obtaining first conversion information by converting the first battery information into a predetermined data structure and obtaining second conversion information by converting the second battery information into the predetermined data structure; and
a data output step of outputting the first conversion information and the second conversion information,
wherein the first communication protocol employs a request-response method,
wherein the second communication protocol does not employ a request-response method,
wherein the predetermined data structure of the first conversion information is in a same structure as the predetermined data structure of the second conversion information, and
wherein the predetermined data structure of the first conversion information and the predetermined data structure of the second conversion information include a battery information value.

18. The method of claim 17, wherein the request-response method of the first communication protocol includes:
sending an information provision request, by the first communication unit; and
receiving the first battery information from the battery management system.

19. The method of claim 17, wherein the first battery information has a lower demand for real-time processing than the second battery information.

20. The method of claim 17, wherein the first battery information is different from the second battery information,
wherein the first battery information is battery state information including at least one of voltage, current, temperature, state of charge (SOC) and state of health (SOH) of the battery, and wherein the second battery information includes at least one of battery system information, battery diagnosis information and battery-related control information.

* * * * *